(12) United States Patent
Takagi et al.

(10) Patent No.: US 11,137,606 B2
(45) Date of Patent: Oct. 5, 2021

(54) VIRTUAL IMAGE DISPLAY DEVICE AND IMAGE ELEMENT UNIT

(71) Applicant: SEIKO EPSON CORPORATION, Tokyo (JP)

(72) Inventors: Masayuki Takagi, Azumino (JP); Yoshitaka Hama, Chino (JP); Takuya Ikeda, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/828,419

(22) Filed: Mar. 24, 2020

(65) Prior Publication Data
US 2020/0310132 A1    Oct. 1, 2020

(30) Foreign Application Priority Data
Mar. 25, 2019    (JP) .............................. JP2019-056097

(51) Int. Cl.
*G02B 27/01*    (2006.01)
*H04N 5/64*    (2006.01)
*H01L 27/146*    (2006.01)

(52) U.S. Cl.
CPC ..... *G02B 27/0172* (2013.01); *G02B 27/0176* (2013.01); *H01L 27/14623* (2013.01); *H04N 5/64* (2013.01)

(58) Field of Classification Search
CPC ............ G09G 2360/145; G09G 3/3208; G06F 3/011; G02B 27/0172; G02B 27/01; G02B 27/0176; H01L 27/14623
See application file for complete search history.

(56) References Cited

U.S. PATENT DOCUMENTS

2013/0286282 A1* 10/2013 Yamamoto ........ H01L 27/14625
                                                            348/374
2017/0237935 A1*  8/2017 Totani ................ G02B 27/0176
                                                            348/802

FOREIGN PATENT DOCUMENTS

JP         2017-146335 A    8/2017

OTHER PUBLICATIONS

See Bending Basics: The hows and whys of springback and springforward, The Fabricator, Jul. 9, 2014 by Steve Benson https://www.thefabricator.com/thefabricator/article/bending/bending-basics-the-hows-and-whys-of-springback-and-springforward (Year: 2014).*

* cited by examiner

*Primary Examiner* — Robert J Michaud
(74) *Attorney, Agent, or Firm* — Oliff PLC

(57) ABSTRACT

There are provided an image element configured to emit imaging light, a case member configured to house the image element, and a light shielding plate that is attached to a positioning portion provided on the case member and that defines an emission region for imaging light from the image element, thereby attaching the light shielding plate to the case member with high accuracy.

9 Claims, 12 Drawing Sheets

VIRTUAL IMAGE DISPLAY DEVICE AND IMAGE ELEMENT UNIT

The present application is based on, and claims priority from JP Application Serial Number 2019-056097, filed Mar. 25, 2019, the disclosure of which is hereby incorporated by reference herein in its entirety.

BACKGROUND

1. Technical Field

The present disclosure relates to a virtual image display apparatus typified by a head-mounted display and an image element unit applicable to a virtual image display apparatus.

2. Related Art

Known examples of a head-mounted display include such as a device in which heat dissipation is performed while the entire device is reduced in size and weight as illustrated in JP-A-2017-146335. Note that the head-mounted display is also described as an HMD in the following.

However, when a silicon substrate in an image element unit is attempted to be further reduced in size due to a demand for further reduction in size of a device in a configuration such as JP-A-2017-146335, for example, there is a concern that, depending on structure around a light emission surface of an image element, light leakage may occur for an unwanted component of emission components from the image element.

SUMMARY

A virtual image display apparatus according to an aspect of the present disclosure includes an image element configured to emit imaging light, a case member configured to house the image element, and a light shielding plate that is attached to an alignment portion provided on the case member and that defines an emission region for imaging light from the image element.

DESCRIPTION OF EXEMPLARY EMBODIMENTS

Figure 1:
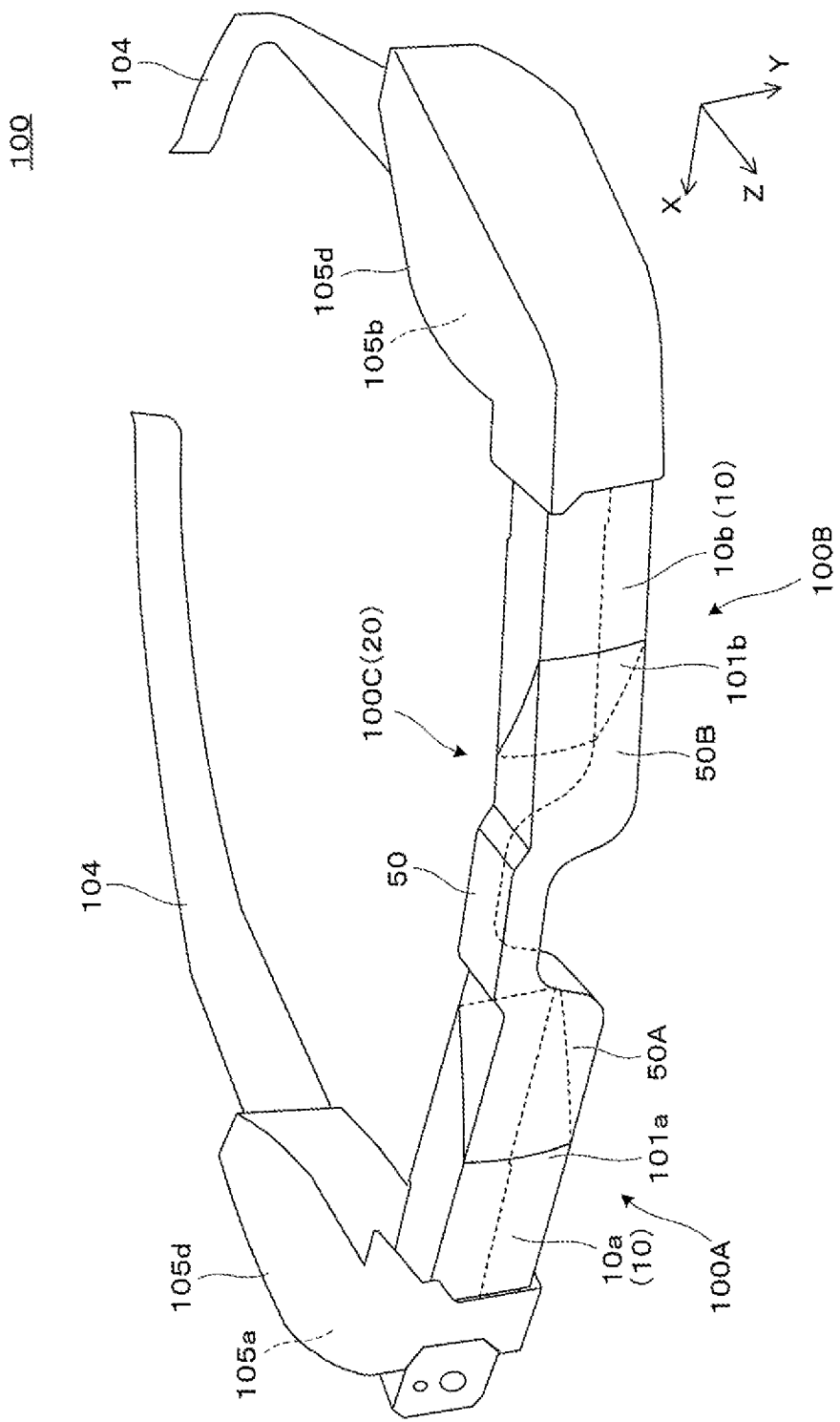
FIG. 1 is a perspective view illustrating an example of schematic appearance of a virtual image display apparatus.
Figure 2:
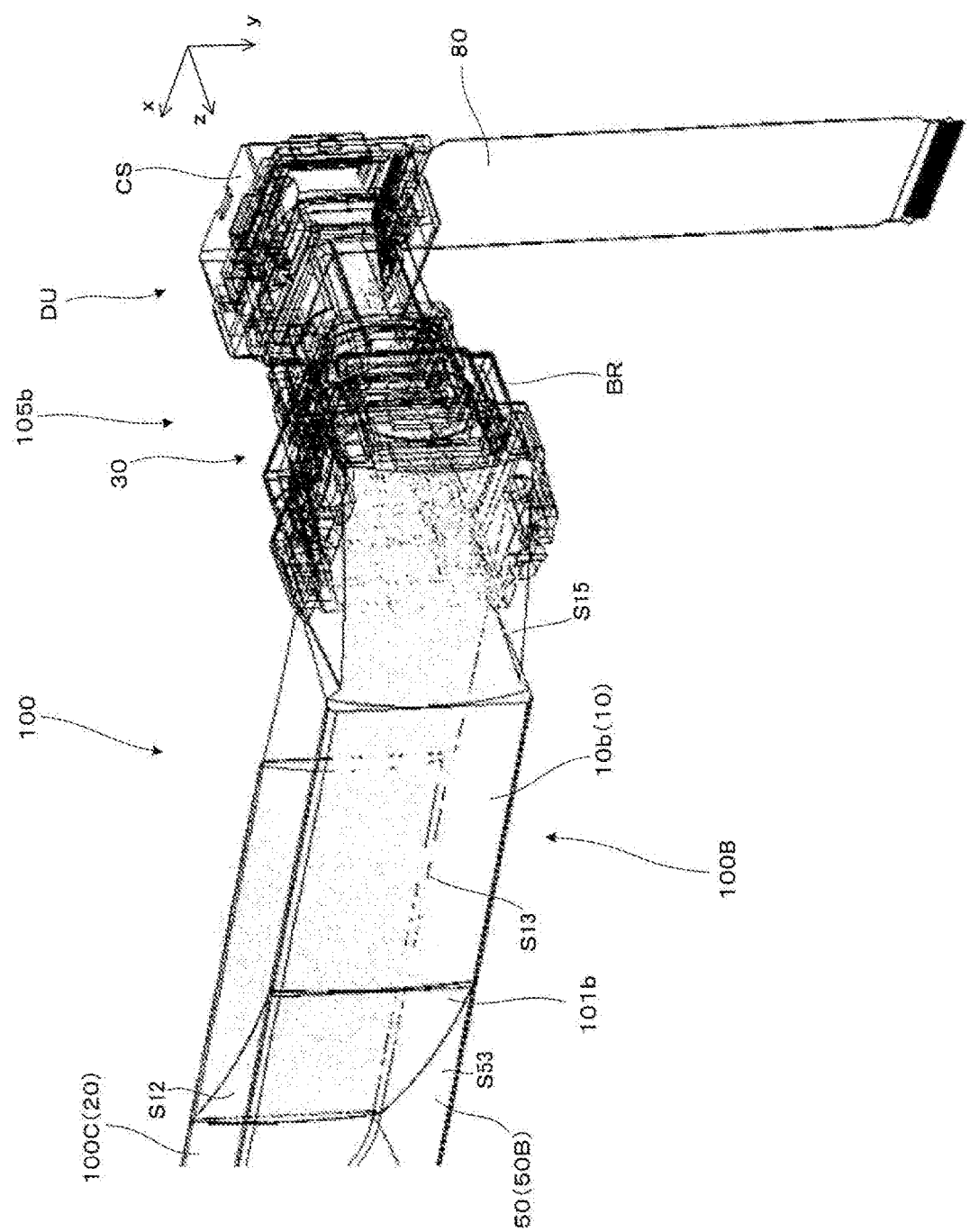
FIG. 2 is a partially enlarged perspective view illustrating a part of an optical system constituting a virtual image display apparatus.
Figure 3:
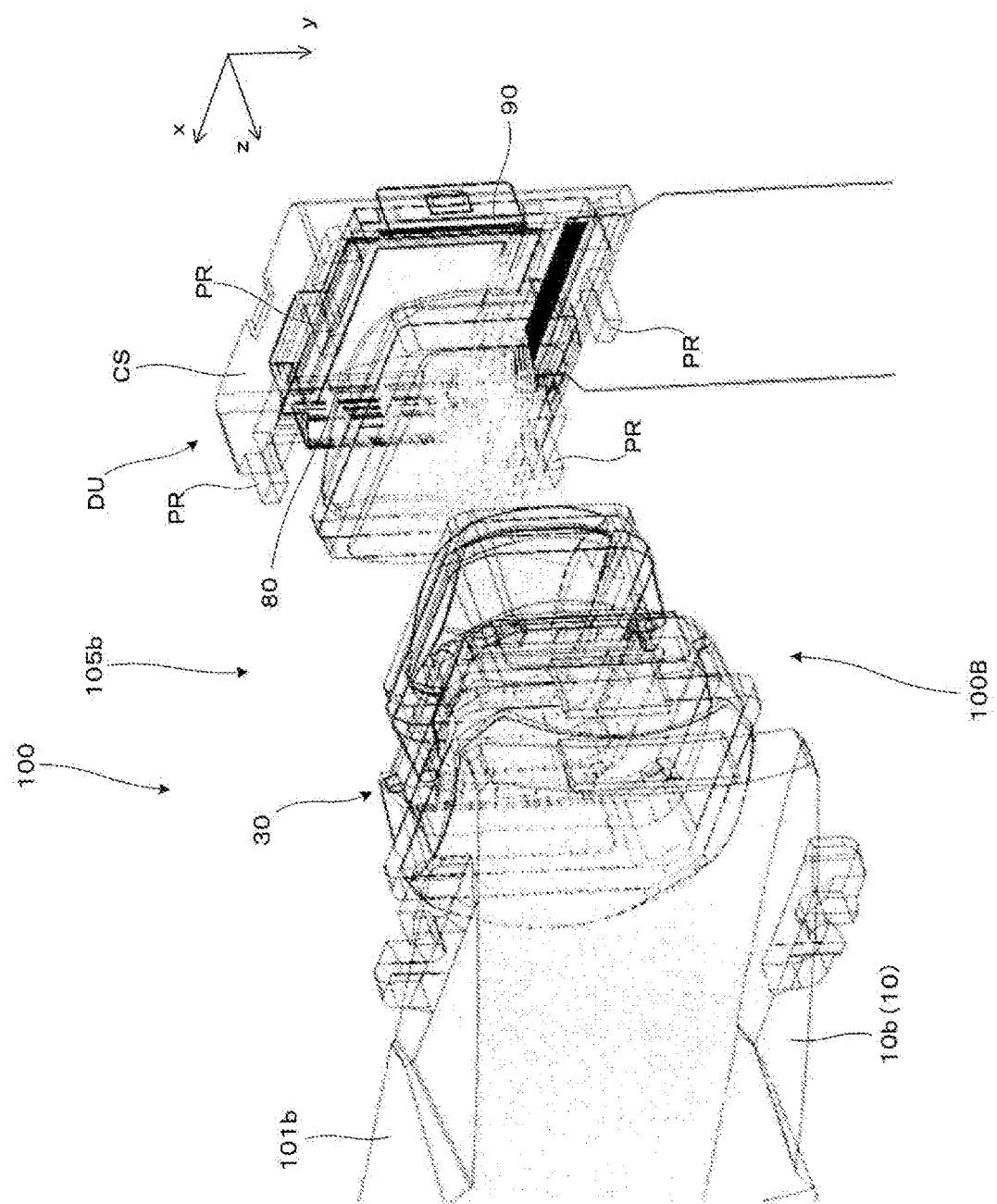
FIG. 3 is a partially enlarged perspective view illustrating a part of an optical system constituting a virtual image display apparatus.
Figure 4:
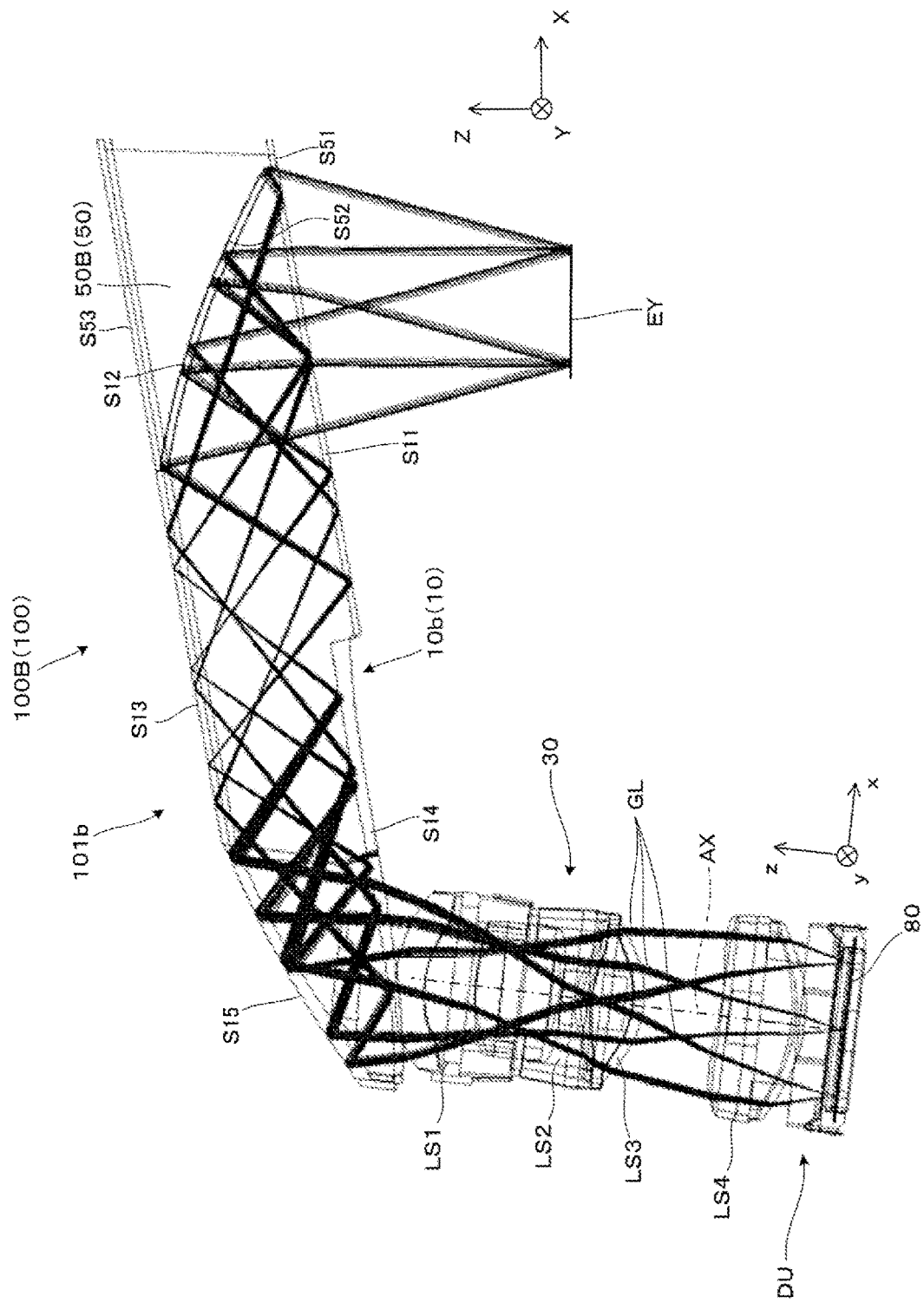
FIG. 4 is a conceptual plan view illustrating light paths of imaging light.

With reference to FIG. 1 and the like, a virtual image display apparatus incorporated with an image element unit according to an embodiment of the present disclosure will be described below in detail. FIG. 1 is a perspective view illustrating an example of schematic appearance of a virtual image display apparatus 100 of the present embodiment. FIGS. 2 and 3 are each a perspective view illustrating some of various optical components constituting the virtual image display apparatus 100, and partially illustrates a portion including an image element unit DU of the present embodiment in an enlarged manner. FIG. 3 illustrates a projection lens 30 that is housed inside a lens barrel BR by removing the lens barrel BR from a state illustrated in FIG. 2. FIG. 4 is a conceptual plan view of light paths of image light (imaging light) in the virtual image display apparatus 100.

As illustrated in FIG. 1 and the like, the virtual image display apparatus 100 is a head-mounted display (HMD) having a visual appearance of eyeglasses, and enables not only an observer or a user wearing the head-mounted display device 100 to visually recognize image light (imaging light) by a virtual image, but also the observer to visually recognize or observe an external image in a see-through manner. The virtual image display apparatus 100 includes a first display device 100A and a second display device 100B. In FIG. 1 and the like, X, Y, and Z are an orthogonal coordinate system, ±X directions correspond to a lateral direction in which both eyes of an observer US wearing the virtual image display apparatus 100 are aligned, +Y direction corresponds to an upward direction orthogonal to the lateral direction in which both the eyes of the observer US are aligned, and +Z direction corresponds to a front direction of the observer US or a front surface direction.

The first display device 100A and the second display device 100B are portions that respectively form a virtual image for the right eye and a virtual image for the left eye. The first display device 100A for the right eye includes a first virtual image forming optical part 101*a* configured to cover the front of the eye of an observer in a transmissive manner, and a first image forming body part 105*a* configured to form image light. The second display device 100B for the left eye includes a second virtual image forming optical part 101*b* configured to cover the front of the eye of an observer in a transmissive manner, and a second image forming body part 105*b* configured to form image light.

The first and second image forming optical parts 101*a* and 101*b* cause the imaging light formed by the first and second image forming body parts 105*a* and 105*b* to be guided so that the imaging light is superimposed on external light to be visible. In illustrations of FIG. 1 and the like, the first and second image forming optical parts 101*a* and 101*b* are not separated and are coupled at a center therebetween forming a transmissive light-guiding unit 100C that is an integrated member. The transmissive light-guiding unit 100C is a light-guiding device of a composite type that provides an image for both eyes to an observer by guiding light. When the above is viewed from a different angle, the transmissive light-guiding unit 100C includes a pair of light-guiding members 10*a* and 10*b*, and a central member 50 that is a light transmission member, and then the first virtual image forming optical part 101a is formed of the light-guiding member 10a and a light transmission part 50a that is a right half of the central member 50. Similarly, the second virtual image forming optical part 101b is formed of the light-guiding member 10b and a light transmission part 50B that is a left half of the central member 50. Hereinafter, the light-guiding member 10a and 10b may also be described as a light-guiding member 10 without distinction.

As FIG. 1 illustrates an example of schematic appearance, the transmissive light-guiding unit 100C of the virtual image display apparatus 100 is supported at both ends by respective exterior members 105d in a cover-like shape, for example. In addition, temples 104 that are temple portions extending rearward from both left and right ends of the corresponding exterior members 105d are each rotatably attached by a hinge (not illustrated), for example. The virtual image display apparatus 100 has an external shape formed as described above and ensures a wearing state by bringing the corresponding portions described above into contact with an observer's ear, temple, and the like.

The first and second image forming body parts 105a and 105b each include an image element (display element) 80 that is an image forming device, an optical system configured to form an image, such as a projection lens 30, a case member CS that houses the optical system, a lens barrel BR, and the like, as the second image forming body part 105b is illustrated in FIGS. 2 and 3. These image forming body parts are supported and housed by being covered with the corresponding exterior members 105d in a cover-like shape (refer to FIG. 1).

While the virtual image display apparatus 100 is composed of the first display device 100A and the second display device 100B as described above, the first display device 100A and the second display device 100B are bisymmetrical and identical in structure. Thus, only the second display device 100B is illustrated in FIGS. 2 and 3, for example, and will be described, and then a detailed description of the first display device 100A is eliminated.

As illustrated, in the second display device 100B, the second image forming body part 105b includes the image element unit DU including the image element 80, and the projection lens 30 housed in the lens barrel BR. Of these, the image element unit DU includes the image element 80 configured to emit imaging light, the case member CS that houses the image element 80, and a light shielding plate 90 that defines an emission region for the imaging light from the image element 80 and blocks unwanted light of emission components.

Hereinafter, a schematic configuration of the image element unit DU of the second display device 100B will be first described in detail.

The image element 80 of the image element unit DU may be an image display element formed of a self-luminous type element such as an organic EL, for example. Further, besides an image display element being a transmissive spatial light modulating device, for example, the image element 80 may include an illumination device that is a backlight for emitting illumination light to an image display element, and a driving control unit configured to control operation. Here, as illustrated, the image element 80 is housed and supported by the case member CS.

The case member CS is a frame structure that is provided in its central portion with a through hole TH (refer to FIG. 10) to house the image element 80 and that emits components of light emitted by the image element 80. The case member CS is a member made of metal having high thermal conductivity such as aluminum or magnesium alloy, for example, and is a one-member structure formed by die casting or the like, i.e., a structure formed of one member. The case member CS also includes a protrusion portion PR serving as an attachment portion for performing attachment alignment for the lens barrel BR (refer to FIG. 2) that houses the projection lens 30.

The light shielding plate 90 is mounted along a surface on a light emission side of the image element 80, of surfaces of the case member CS, to function as a mask for removing unwanted light from light components.

Here, when it is attempted to downsize each part such as a silicon substrate SS (refer to FIG. 7 and the like) constituting the image element 80 due to a demand for reduction in size of a device for the image element unit DU composed of each part as described above, there is a concern that an unwanted component of components of light emitted from the image element 80 may leak in the vicinity of a light emission surface of the image element 80. In the present embodiment, to avoid such a situation, the light shielding plate 90 being a thin plate-shaped member is attached to the image element 80 on its light emission side with high accuracy to suppress leakage of an unwanted component of components of light emitted from the image element 80 with downsizing of a device.

Hereinafter, a schematic configuration of other than the image element unit DU of the second display device 100B will be described.

As illustrated in FIG. 4, for example, the projection lens 30 is a projection optical system including a plurality of optical elements (four lenses LS1 to LS4 in the example illustrated in the drawing) arrayed along a direction (optical axis direction) in which an incident-side optical axis AX extends. Here, the projection lens 30 is housed and supported by a lens barrel (not illustrated) integrally molded by resin molding, for example. Optical elements constituting the projection lens 30, i.e., the four lenses LS1 to LS4, may include an aspheric lens including both a non-spherical surface that is non-axisymmetric and an aspheric surface that is axisymmetric, for example. At this time, the projection lens 30 works together with an optical surface or a reflection surface of the light-guiding member 10b of the second virtual image forming optical part 101b to enable an intermediate image to be formed inside the light-guiding member.

As described above, the second virtual image forming optical part 101b includes the light-guiding member 10b for guiding light and transmissive viewing, and the light transmission part 50B for transmissive viewing. The second virtual image forming optical part 101b is also provided on its front surface portion with a hard coat layer serving as a protective layer to cover and protect its body member. The second virtual image forming optical part 101b is positioned and fixed with respect to the projection lens 30 with high accuracy by being screwed to an optical component holding member like the lens barrel BR, for example.

With reference to FIG. 4, an example of guiding imaging light GL using the virtual image display apparatus 100 will be conceptually described below. In FIGS. 2 to 4, and the like, x, y, and z are an orthogonal coordinate system, z direction corresponds to an optical axis direction of an optical system constituting the second display device 100B, and x direction and y direction each correspond to an in-plane direction in a panel plane of the image element 80 with the z-direction as a normal line direction. The x-direction corresponds to a horizontal direction, and the y-direction corresponds to a vertical direction.

As described above, the second display device 100B includes the image element unit DU including the image element 80, the projection lens 30, and the second virtual image forming optical part 101b that guides the imaging light GL via the image element 80 and the projection lens 30, as optical components for forming and guiding the imaging light GL. The second virtual image forming optical part 101b includes the light-guiding member 10b for guiding light and transmissive viewing, and the light transmission part 50B for transmissive viewing that is a part of the central member 50, as described above.

In one example here, the image element 80 serving as an image forming device has a rectangular shape and forms an image surface in a rectangular shape. The imaging light GL is emitted from each position of the image surface. Here, the image surface has a normal line direction in the z direction. In other words, the z direction corresponds to the optical axis direction in which the optical axis of the projection lens 30 extends. In addition, one direction of the image surface in a rectangular shape or the image element 80 of in-plane directions of the image surface perpendicular to the z direction corresponds to the x direction. Thus, with respect to the in-plane directions of the image surface, a direction perpendicular to the x-direction is the y-direction. Here, a longitudinal direction of the rectangular shape is indicated as the x direction.

The projection lens 30 allows the imaging light GL from the image element 80 to pass through, and emits (projects) the imaging light GL having passed through the four lenses LS1 to LS4 arrayed along the incident-side optical axis AX toward the light-guiding member 10b constituting the second virtual image forming optical part 101b.

As described above, the second virtual image forming optical part 101b is assembled with respect to the projection lens 30 with high accuracy to guide the imaging light GL from the projection lens 30.

Hereinafter, details of a configuration for guiding the imaging light GL in the second virtual image forming optical part 101b will be described below.

First, the light-guiding member 10b of the second virtual image forming optical part 101b includes first to fifth surfaces S11 to S15 as side surfaces each having an optical function. Of these surfaces, the first surface S11 and the fourth surface S14 are adjacent, and the third surface S13 and the fifth surface S15 are adjacent. Further, the second surface S12 is disposed between the first surface S11 and the third surface S13. A half mirror layer is attached to the surface of the second surface S12. The half mirror layer is a reflective film having optical transparency (a semitransparent reflective film) that is formed by depositing a metallic reflective film or a dielectric multilayer film, and is provided with an appropriate reflectance with respect to the imaging light. Specifically, the light-guiding member 10b includes a transmissive and reflective surface that covers the front of the eyes when worn by the observer.

The light transmission part 50B of the second virtual image forming optical part 101b is a member (auxiliary optical block) that assists a transmissive function of the light-guiding member 10b, and that is integrally fixed with the light-guiding member 10b to form the single second virtual image forming optical part 101b. The light transmission part 50B has a first transmission surface S51, a second transmission surface S52, and a third transmission surface S53, as side surfaces each having an optical function. The second transmission surface S52 is disposed between the first transmission surface S51 and the third transmission surface S53. The first transmission surface S51 is on an extended surface of the first surface S11 of the light-guiding member 10b, the second transmission surface S52 is a curved surface that is joined to and integrated with the second surface S12, and the third transmission surface S53 is on an extended surface of the third surface S13 of light-guiding member 10b. In other words, the first surface S11 and the first transmission surface S51 are adjacent to each other, and similarly, the third surface S13 and the third transmission surface S53 are adjacent to each other, and both are aligned to be flush with each other and form a smooth surface.

With reference to FIG. 4, a light path of the imaging light GL in the second virtual image forming optical part 101b will be schematically described below. The light-guiding member 10b causes the imaging light GL from the projection lens 30 to be incident, and guides the imaging light GL toward an eye EY of the observer using reflection and the like on the first to fifth surfaces S11 to S15. Specifically, the imaging light GL from the projection lens 30 is first incident on the fourth face S14 and reflected by the fifth face S15 to be incident again from inside the fourth surface S14 and totally reflected by the fourth surface S14. The imaging light GL is then incident on and totally reflected by the third surface S13, and is incident on and totally reflected by the first surface S11. The imaging light GL totally reflected by the first surface S11 is incident on the second surface S12 to be partially reflected while partially passing through the half mirror layer provided on the second surface S12, and is then once more incident on and passes through the first surface S11. The imaging light GL having passed through the first surface S11 is incident, as a substantially parallel luminous flux, on the eye EY of the observer or an equivalent position. In other words, the observer observes an image formed by the imaging light GL as a virtual image.

As described above, the second virtual image forming optical part 101b is configured to allow the observer to visually recognize the imaging light using the light-guiding member 10b, and to cause the light-guiding member 10b and the light transmission part 50B to work together to allow the observer to observe an external image with little distortion. At this time, the third surface S13 and the first surface S11 are substantially parallel to each other (diopter is approximately 0) to cause almost no aberration or the like in external light. Further, similarly, the third transmission surface S53 and the first transmission surface S51 are planes that are substantially parallel to each other. Furthermore, the third transmission surface S53 and the first surface S11 are planes substantially parallel to each other to cause almost no aberration or the like. As described above, the observer observes the external image that has no distortion through the central member 50 serving as a light transmission member.

As described above, in the present embodiment, the imaging light from the image element 80 is guided in the interior of the light-guiding member 10b, using five reflections on from the first surface S11 to the fifth surface S15, including at least two total reflections. As a result, both the display of the imaging light and the see-through viewing that causes the external light to be visually recognized can be achieved, and aberration correction of the imaging light GL can be performed.

The configuration described above is identical even in the first display device 100A (refer to FIG. 1). This enables forming respective images corresponding to the left and right eyes.

Figure 5:
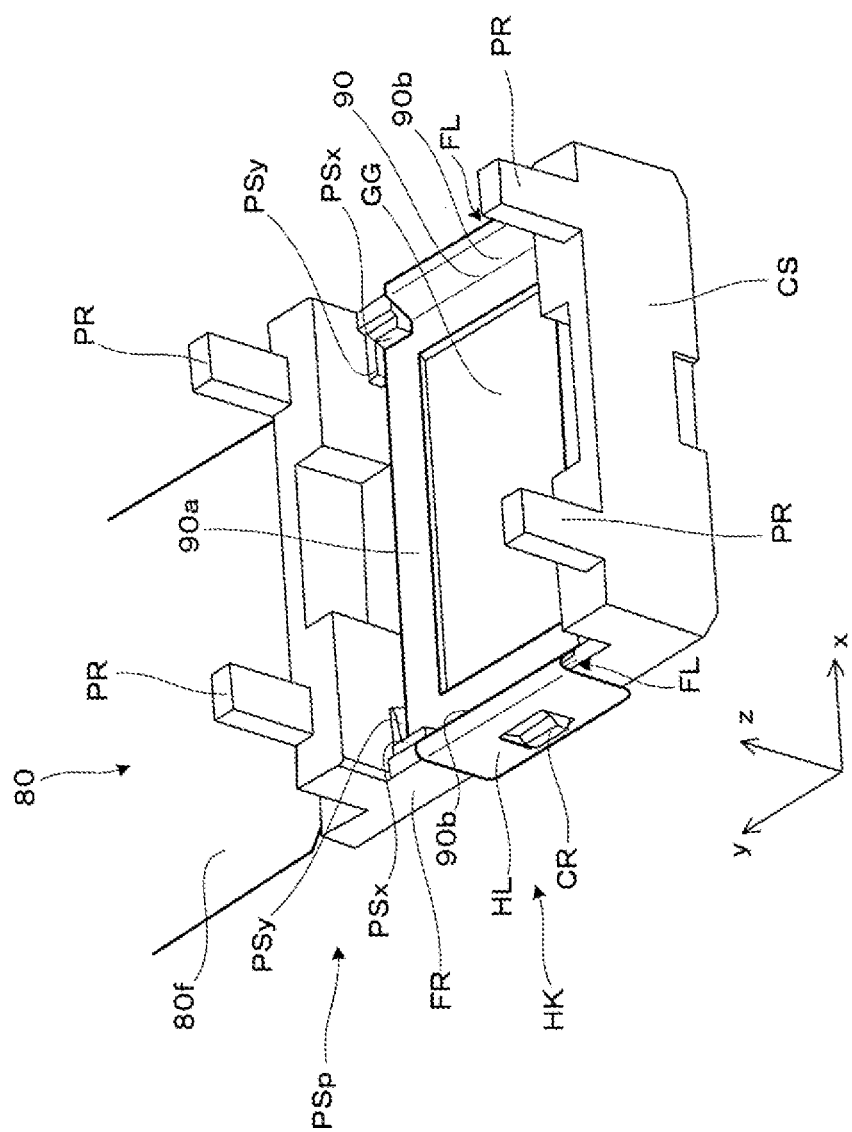
FIG. 5 is a perspective view illustrating an example of an image element unit.

With reference to FIG. 5 and the like, one configuration example of the image element unit DU according to the present embodiment will be described below in detail.

Figure 6:
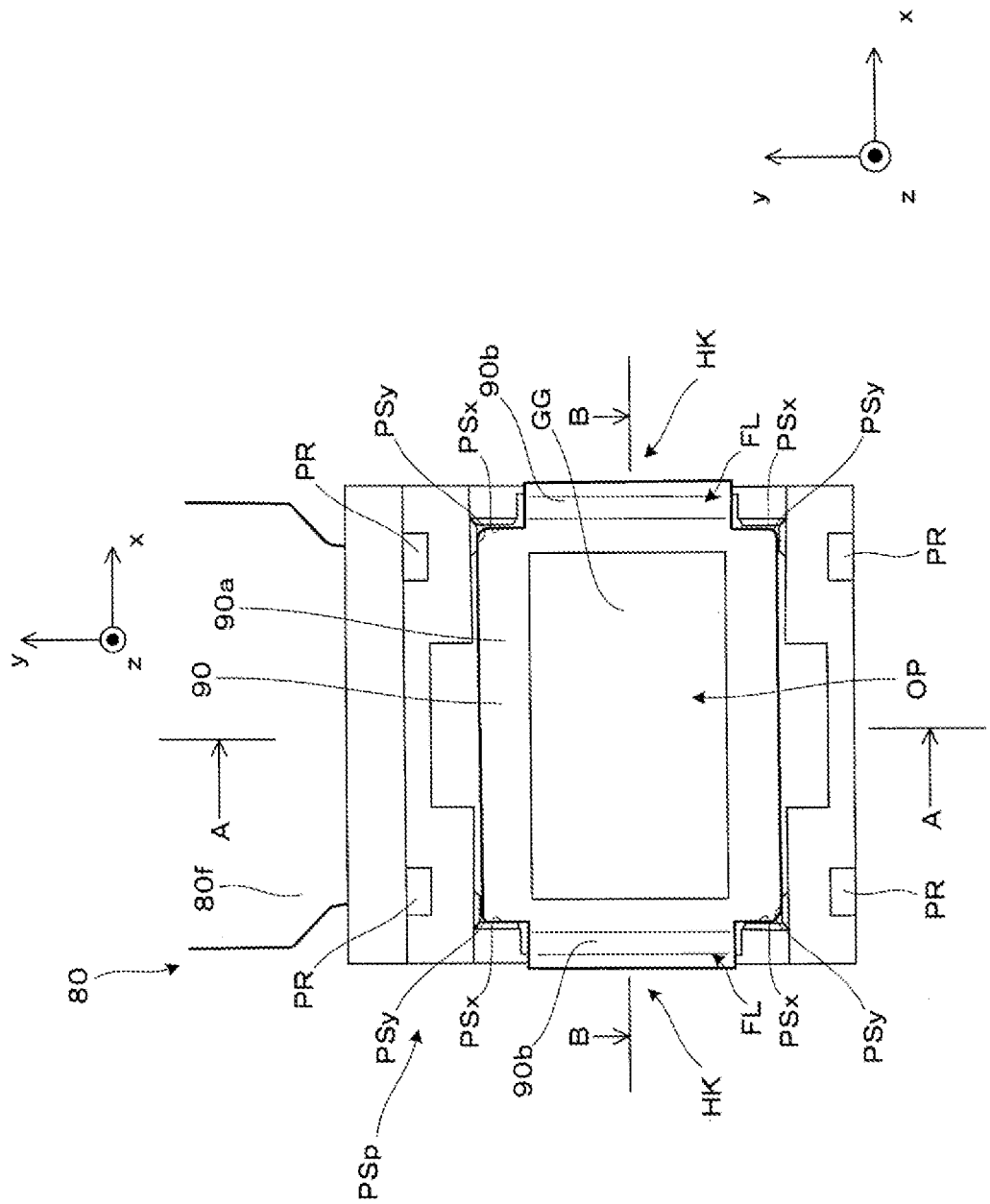
FIG. 6 is a front view illustrating an example of an image element unit.
Figure 7:
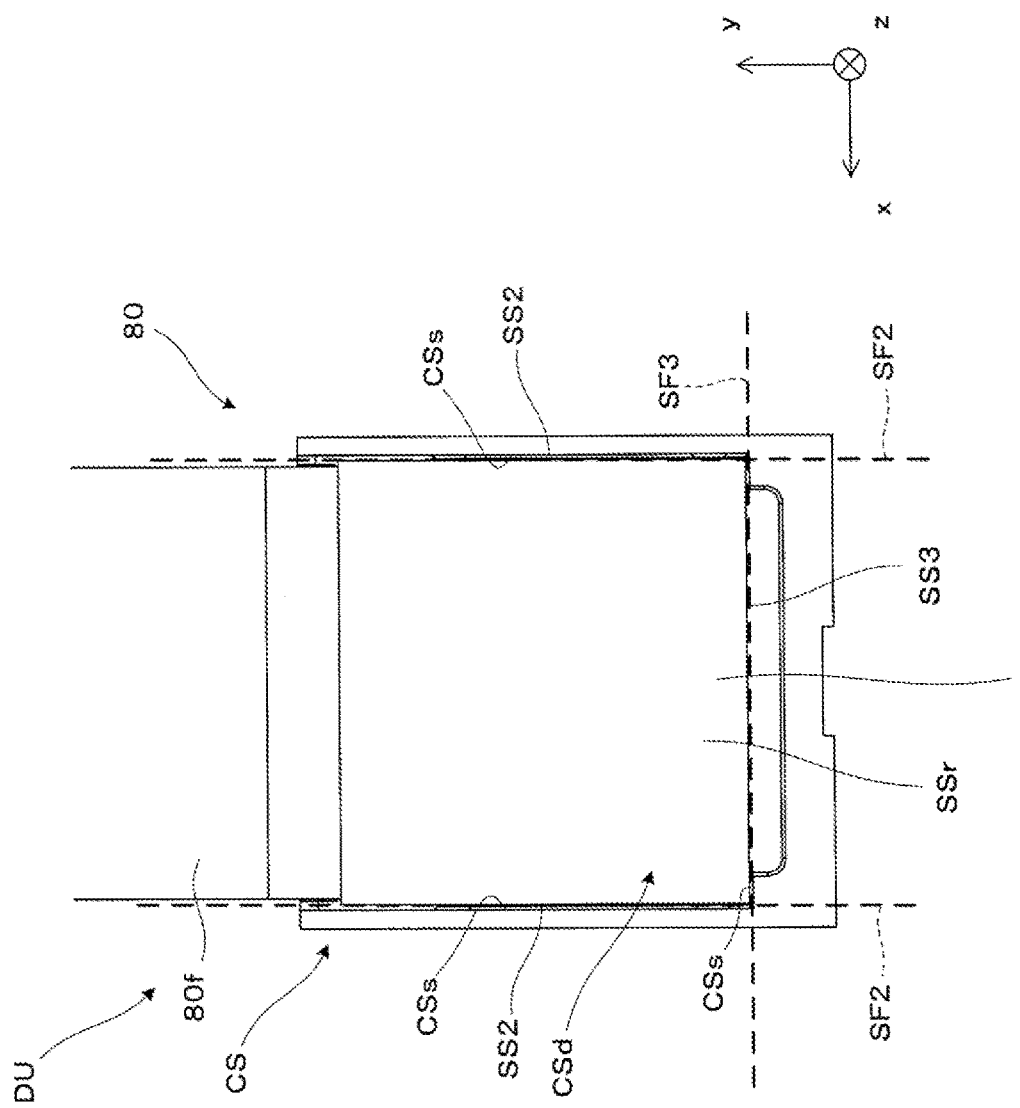
FIG. 7 is a rear view illustrating an example of an image element unit.
Figure 8:
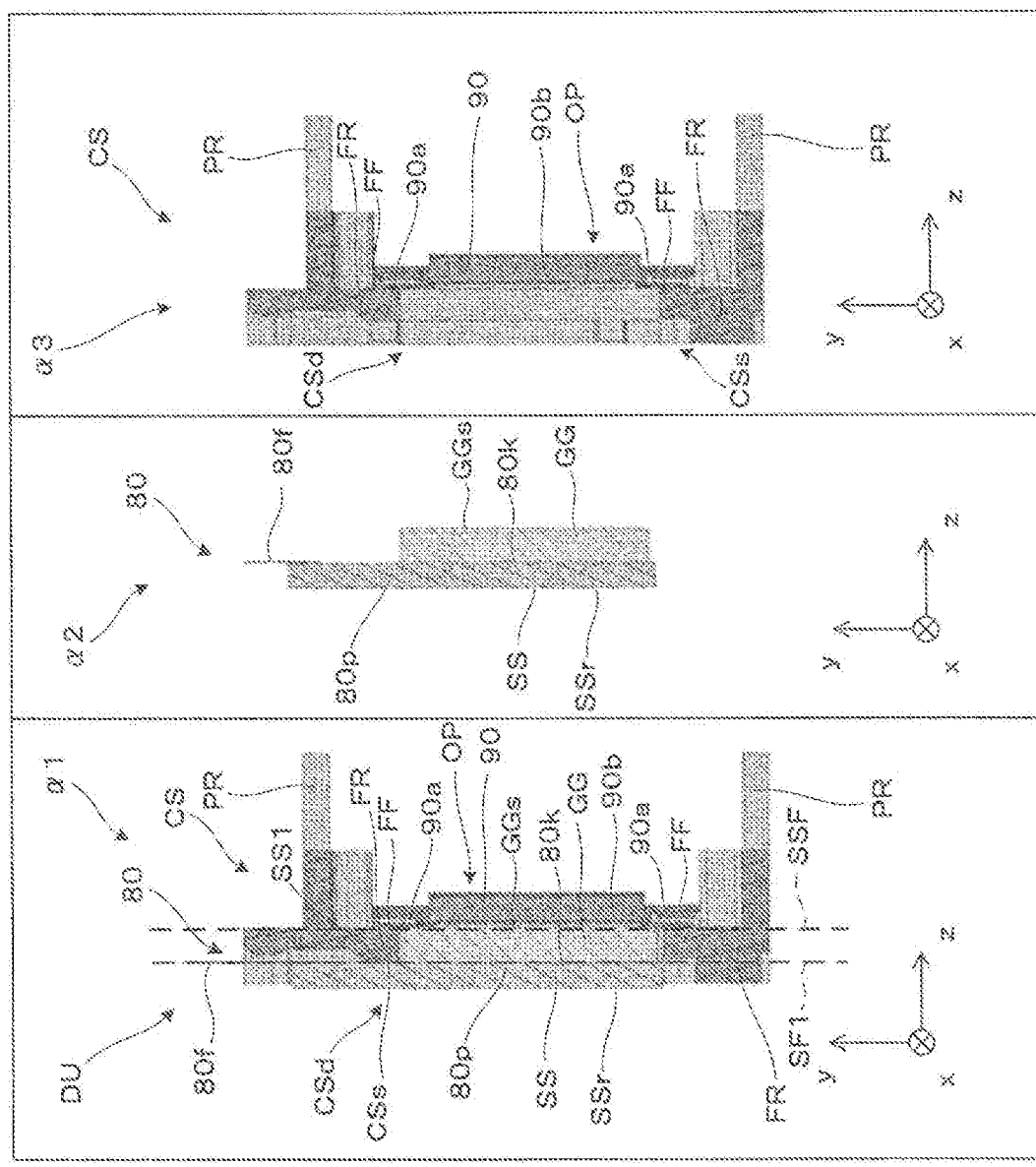
FIG. 8 is a side cross-sectional view illustrating an example of an image element unit and each portion of the image element unit.
Figure 9:
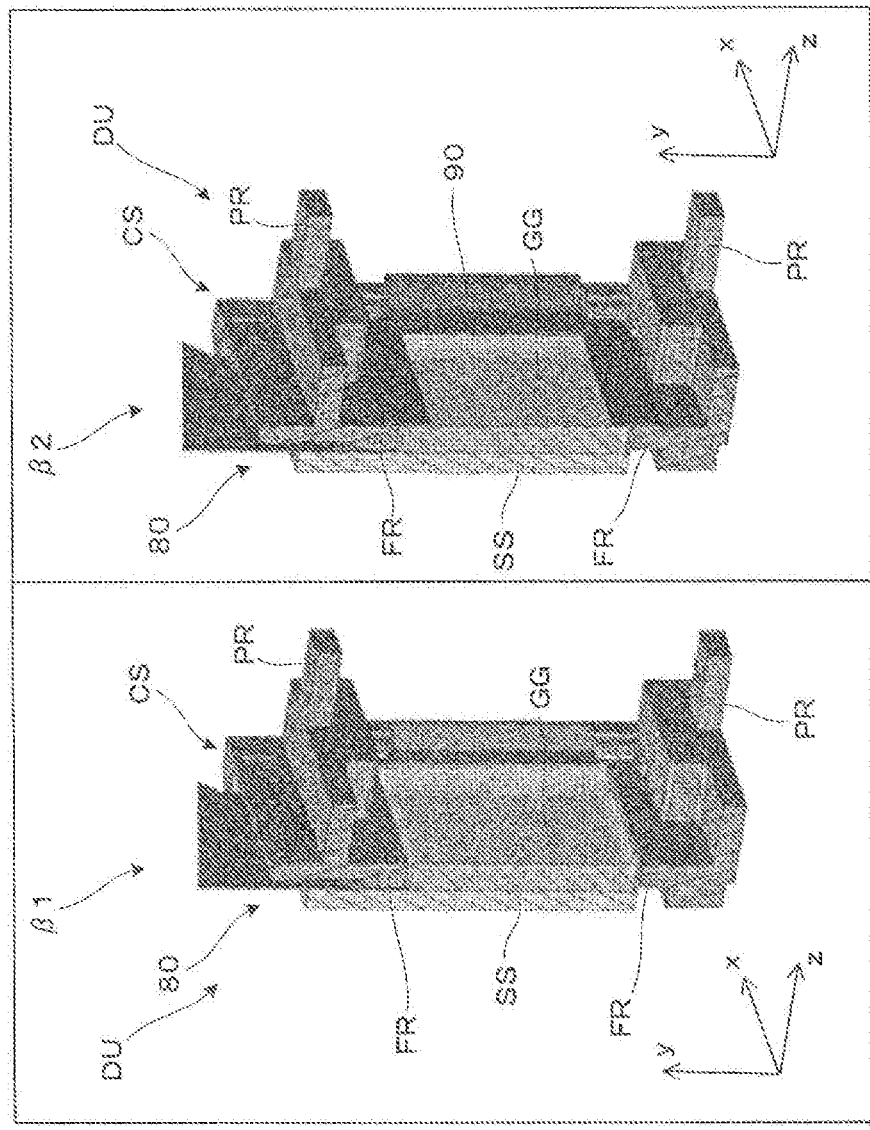
FIG. 9 is a perspective view of an example of an image element unit that is partially cut out.

FIG. 5 is a perspective view illustrating an example of the image element unit DU, FIG. 6 is a front view, and FIG. 7 is a rear view. FIG. 8 is a side cross-sectional view illustrating a state of the image element unit DU and the case member CS assembled with the image element 80 and the light shielding plate 90 constituting respective portions of the image element unit DU. In FIG. 8, a state α1 illustrates a state in which the image element 80, the light shielding plate 90, and the case member CS are assembled to form the image element unit DU, a state α2 illustrates a state of only the image element 80, and a state α3 illustrates a state in which only the image element 80 is removed from the image element unit DU. In addition, FIG. 9 is a perspective view of the image element unit DU that is partially cut out. FIG. 8 is a cross-sectional view taken along line A-A in FIG. 6, and the cut-out cross section in FIG. 9 corresponds to FIG. 8. In FIG. 9, a state β1 illustrates a state in which only the light shielding plate 90 is removed from the image element unit DU, and a state β2 illustrates a state in which the image element 80, the light shielding plate 90, and the case member CS are assembled to form the image element unit DU.

As illustrated, and as described above, the image element unit DU includes the image element 80, the case member CS, and the light shielding plate 90.

Hereinafter, a configuration of the image element 80 among the parts described above constituting the image element unit DU will be described. As illustrated in FIG. 5, 6, or 8, and the like, for example, the image element 80 includes a body part 80p in a rectangular plate-like shape housed in the case member CS and a flexible printed circuits (FPC) part 80f connected to and extending from the body part 80p. Of these, the body part 80p includes a silicon substrate SS that is provided with various circuits and the like, and that forms an outline of the body part 80p, a light emitting part 80k that is an organic EL element including an organic EL material, configured to generate collar light to be imaging light, and a protective glass GG for sealing that works together with the silicon substrate SS to seal the light emitting part 80k. The image element 80 performs a light emitting operation in accordance with a drive signal received from the FPC part 80f to emit imaging light toward the protective glass GG of the silicon substrate SS and the protective glass GG, i.e., +z side.

Next, a configuration of the case member CS among the parts described above constituting the image element unit DU will be described. As described above, the case member CS has a frame structure for housing the image element 80 and includes the protrusion portion PR serving as an attachment portion for performing attachment alignment for the lens barrel BR (refer to FIG. 2).

In addition to the above, as illustrated in FIGS. 7 and 8, for example, the case member CS supports and fixes the image element 80 while being provided with a heat dissipation structure CSd that allows the image element 80 to be opened and exposed on its side opposite to a side for emitting the imaging light. In other words, to open a part of the image element 80, there is provided the heat dissipation structure CSd in a U-shape that opens toward a back surface (−z side) of the silicon substrate SS. Accordingly, a back portion of the silicon substrate SS is exposed from the case member CS with the image element 80 housed, so that heat dissipation of the image element 80 can be promoted.

The case member CS also includes a housing portion CSs that houses the image element 80, for example, in a place adjacent to the heat dissipation structure CSd and in contact with a side surface of the image element 80. More specifically, as illustrated in FIGS. 7 and 8, the housing portion CSs is formed as a surface that comes into contact with each of end surfaces SS1 to SS3 other than a back surface SSr opposite to a light emission side (−z side) among end surfaces of the silicon substrate SS in a rectangular plate-like shape. This allows alignment to be performed on the first reference plane SF1 that is a reference for alignment in +z direction, a second reference plane SF2 that is a planar portion serving as a reference for alignment in ±x direction, and a third reference surface SF3 that is a planar portion serving as a reference for alignment in −y direction, so that alignment with high accuracy is achieved.

In addition, as illustrated in FIGS. 8 and 9, for example, the case member CS includes a frame-shaped portion FR that forms a rectangular opening in a central portion on the light emission side of the image element 80, being a side (+z side) opposite to the heat dissipation structure CSd and the housing portion CSs. As illustrated in FIG. 8, the alignment with high accuracy using the housing CSs described above allows a flat surface FF being a surface of the frame-shaped portion FR on +z side to be aligned flush with a surface (glass surface) GGs of the protective glass GG, being the light emission surface of the image element 80, in a plane parallel to an xy plane (as the reference plane SSF).

As illustrated in FIGS. 5 and 6, the case member CS also includes an alignment portion PSp provided corresponding to a planar portion 90a of the light shielding plate 90 described below, for alignment when the light shielding plate 90 is attached. More specifically, as a configuration of the alignment portion PSp, first, projections PSx and PSy for alignment are provided fitted with four corners of the planar portion 90a in a rectangular shape. Accordingly, alignment with high accuracy in ±x direction and ±y direction is achieved. For example, when the protruding portions PSx and PSy are provided in the four corners with little margin in accordance with dimensions of the planar portion 90a, an installation position of the light shielding plate 90 in ±x direction and ±y direction can be accurate. In addition, as illustrated in FIGS. 5 and 6, for example, as portions constituting the alignment portion PSp, a pair of protrusion portions CR each being a claw-shaped protrusion that is to be fitted into the light shielding plate 90 is provided on respective outer side surfaces of the frame-shaped part FR on ±x side. When the protrusions CR are fitted to reliably bring the planar portion 90a into contact with the flat surface FF of the case member CS, alignment with high accuracy in −z direction is achieved. The protrusions CR each extend in a direction avoiding ±y direction being an extension direction of the FPC part 80f.

Finally, a configuration of the light shielding plate 90 among the parts described above constituting the image element unit DU will be described. The light shielding plate 90 is a sheet metal formed of a single thin sheet (e.g., a thickness of about 0.1 mm) made of metal such as stainless steel or the like as a material. The light shielding plate 90 has a front surface that is subjected to a bake coating or matte black plating, and that has a high light-shielding property. As illustrated in FIG. 5 and the like, for example, the light shielding plate 90 has the planar portion 90a and peripheral portions 90b provided at outer edges (sides outside the central portion) of the planar portion 90a.

The planar portion 90a has a rectangular shape, and particularly has a frame shape provided in its central portion with an opening OP that defines a passage range of effective light of a component emitted from the image element 80.

The light shielding plate 90 restricts the passage range of effective light using the planar portion 90a in a frame shape to function as a light shielding member that blocks unwanted light of emission components while defining an emission region for the imaging light GL from the image element 80.

The peripheral portions 90b each form a spring structure composed of a bent portion FL formed by being bent multiple times (two times). The peripheral portions 90b are each further provided in its side surface with a hole HL corresponding to one of the protrusions CR, forming a hook structure HK with the one of the protrusions CR and the hole HL, to function as an attachment portion for being attached to the case member CS. In other words, the hook structure HK fixes the light shielding plate 90 to the case member CS. Details of attachment structure will be described below with reference to FIGS. 11 and 12.

The light shielding plate 90 is attached to the case member CS with a structure as described above. At this time, as described above, high accurate alignment in ±x direction and ±y direction is performed using the alignment portion PSp of the case member CS in the planar portion 90a in a rectangular shape, and the light shielding plate 90 reliably comes into contact with the flat surface FF in −z direction using the peripheral portions 90b. Accordingly, the light shielding plate 90 is attached to the case member CS with high accuracy.

In the above-described case, the light shielding plate 90 is positioned and fixed with high accuracy while being close to the image element 80 on its light emission side (+z side). Thus, the planar portion 90a of the light shielding plate 90 defines an emission region for the imaging light GL emitted from the image element 80. In other words, the light shielding plate 90 reliably allows passage of an active component as the imaging light GL. On the other hand, the light shielding plate 90 can block (shield) or dim unwanted light such as reflected light or scattered light due to unintended reflection, for example. In addition, the peripheral portions 90b inclined of the light shielding plate 90 and an inclined portion on a peripheral side of the frame-shaped portion FR constituting the case member CS can be separated to some extent from a passage range of the imaging light GL (refer to FIG. 4) to be an active component. This enables avoiding or suppressing occurrence of a situation in which unintended reflections occur in these inclined portions to degrade an image. In particular, progress in downsizing of a device reduces a region outside an emission range of light in the image element 80 to cause difficulty in suppressing light leakage or an occurrence of unwanted light while alignment is performed on each part like the image element 80, for example. For example, when light is blocked by integrally providing a mask portion that removes unwanted light from light components emitted from the image element 80 as a part of the case member CS, sufficient accuracy cannot be obtained depending on accuracy of machining for manufacturing the mask portion. This may cause light leakage, unwanted light due to unintended reflection, and the like. In contrast, in the present embodiment, the light shielding plate 90 is provided on the light emission side (+z side) of the image element 80 and the light-shielding plate 90 can be attached with high accuracy to enable such a situation to be avoided.

Hereinafter, manufacturing of the image element unit DU according to the present embodiment, consequently a matter related to manufacturing of the virtual image display apparatus 100, will be described.

First, an example of attaching the image element 80 to the case member CS will be described with reference to FIG. 10.

Figure 10:
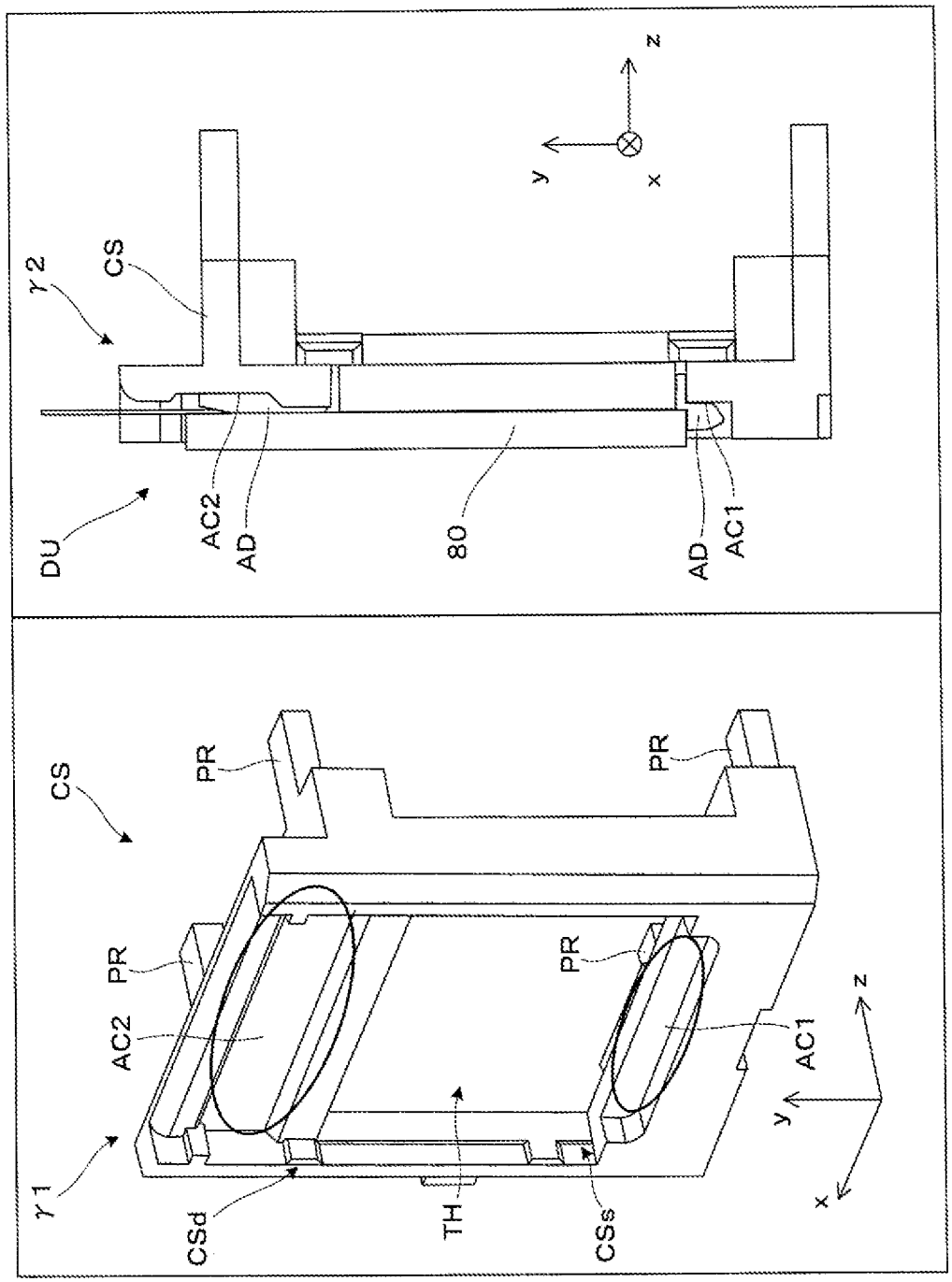
FIG. 10 is a diagram illustrating an adhesive coating portion in an image element unit.

FIG. 10 is a diagram illustrating an adhesive coating portion in the image element unit DU. In FIG. 10, a state γ1 is a perspective view illustrating a state of an example of the case member CS prior to attaching of each part like the image element 80, for example, and illustrates places of a plurality of the adhesive coating portions in the case member CS, i.e., bonded places of the image elements 80. In addition, a state γ2 is a side cross-sectional view illustrating a state in which the image element 80, the light shielding plate 90, and the case member CS are assembled forming the image element unit DU, and illustrating a state in which the image element 80 is bonded by adhesives applied to the adhesive coating portions.

As illustrated, in this case, the case member CS includes an adhesive coating portions AC1 and AC2 provided at a respective plurality of places (two places) spaced apart along ±y direction being an extension direction of the FPC part 80f of the image element 80. The image element 80 is bonded with an adhesive AD applied to each of the adhesive coating portions AC1 and AC2, and thus is fixed to the case member CS at a desired position. While various materials are considered to be available for the adhesive AD, it is conceivable to use, for example, an ultraviolet curable resin. In this case, bonding and fixing along the FPC portion 80f that is most affected by stress or the like after bonding enables fixing position with increased resistance to the stress.

Figure 11:
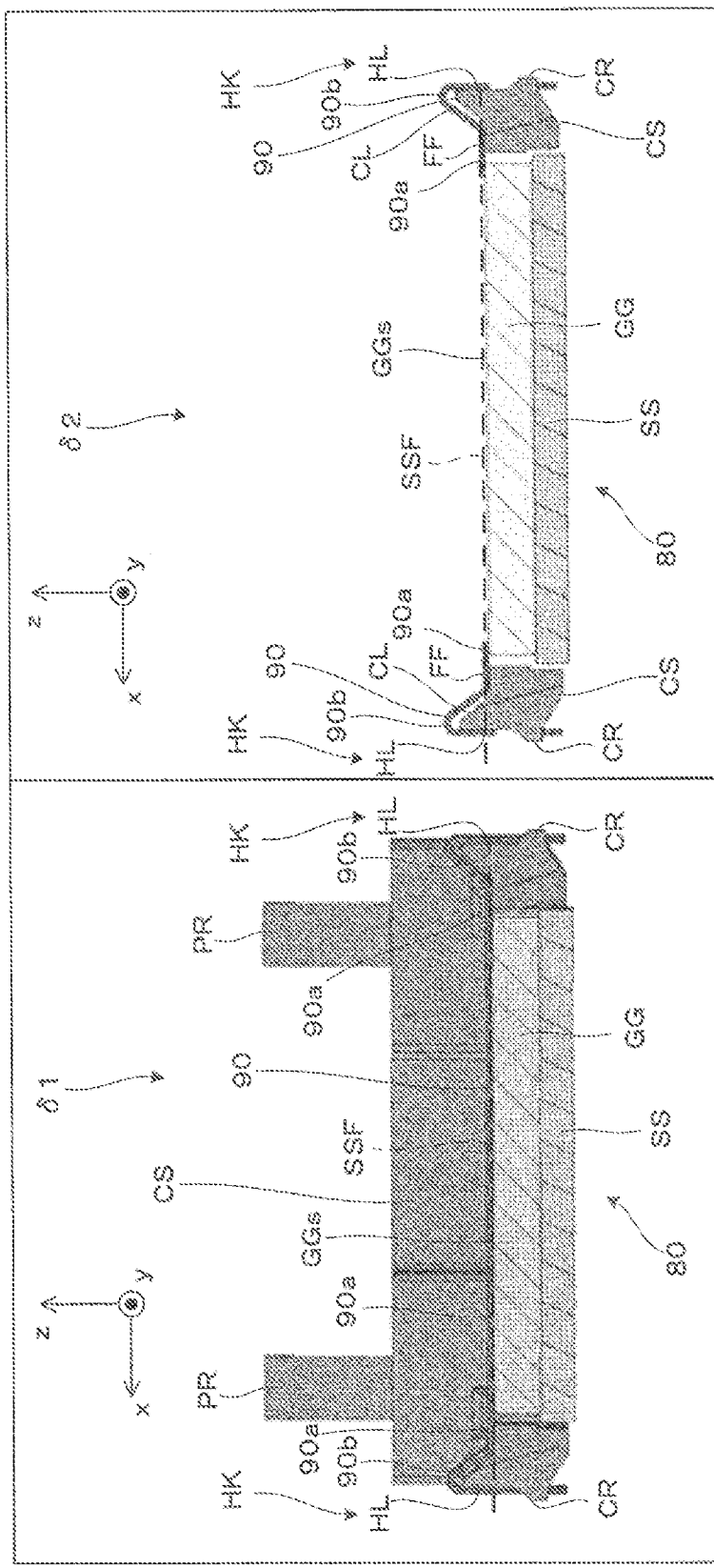
FIG. 11 is a conceptual cross-sectional view for illustrating an example of a structure of a light shielding plate in an image element unit.

Next, an example of attaching the light shielding plate 90 to the case member CS will be described with reference to FIGS. 11 and 12. FIG. 11 is a conceptual cross-sectional view for illustrating an example of a structure of the light shielding plate 90 in a state of being attached to the image element unit DU. A state δ1 is a cross-sectional view taken along line B-B in FIG. 6, and a state δ2 is a view illustrating an attachment portion between the case member CS and the light shielding plate 90 extracted from the state 51.

As illustrated, in this case, the light shielding plate 90 is fixed to the case member CS by the pair of hook structures HK composed of the corresponding protruding portions CR of the case member CS and the corresponding holes HL of the light shielding plate 90. In other words, the light shielding plate 90 has paired structures in ±x direction, so that the light shielding plate 90 has an M shape in a cross-sectional view. In addition, at this time, for each of the paired structures, the spring structure is formed by providing the bent portion FL formed by being bent at least two or more times (bent two times in the illustrated example) between the opening OP and the hole HL, and thus attaching of the light shielding plate 90 to the case member CS is simplified and reliable. In other words, existence of the spring structure allows a place of the peripheral portion 90b forming the spring structure of the light shielding plate 90 to be temporarily expanded to insert and fit the holes HL onto the corresponding protrusions CR of the case member CS for attachment to the case member CS to fix the shielding plate 90 to the case member CS, and then the existence of the spring structure enables attaching and fixing the light shielding plate 90 to the case member CS while generating a force causing the planar portion 90a of the light shielding plate 90 to come into contact with the flat surface FF using force returning to an initial state from an expanded state, generated in the spring structure. That is, the surface GGs of the protective glass GG facing flush with the flat surface FF and the reference surface SSF comes into close contact with the planar portion 90a forming the opening OP. In other words, the light shielding plate 90 includes the planar portion 90a at a place where the flat surface FF of the case member CS and the surface GGs being the light emission surface of the image element 80 are aligned flush with each other.

Hereinafter, an example of an attaching step of the light shielding plate 90 will be described with reference to FIG. 12. In FIG. 12, a state ε1 illustrates a state in the middle of attaching of the light shielding plate 90. On the other hand, a state ε2 illustrates a state where the attaching of the light shielding plate 90 is completed, the state corresponding to the state δ2 of FIG. 11.

Figure 12:
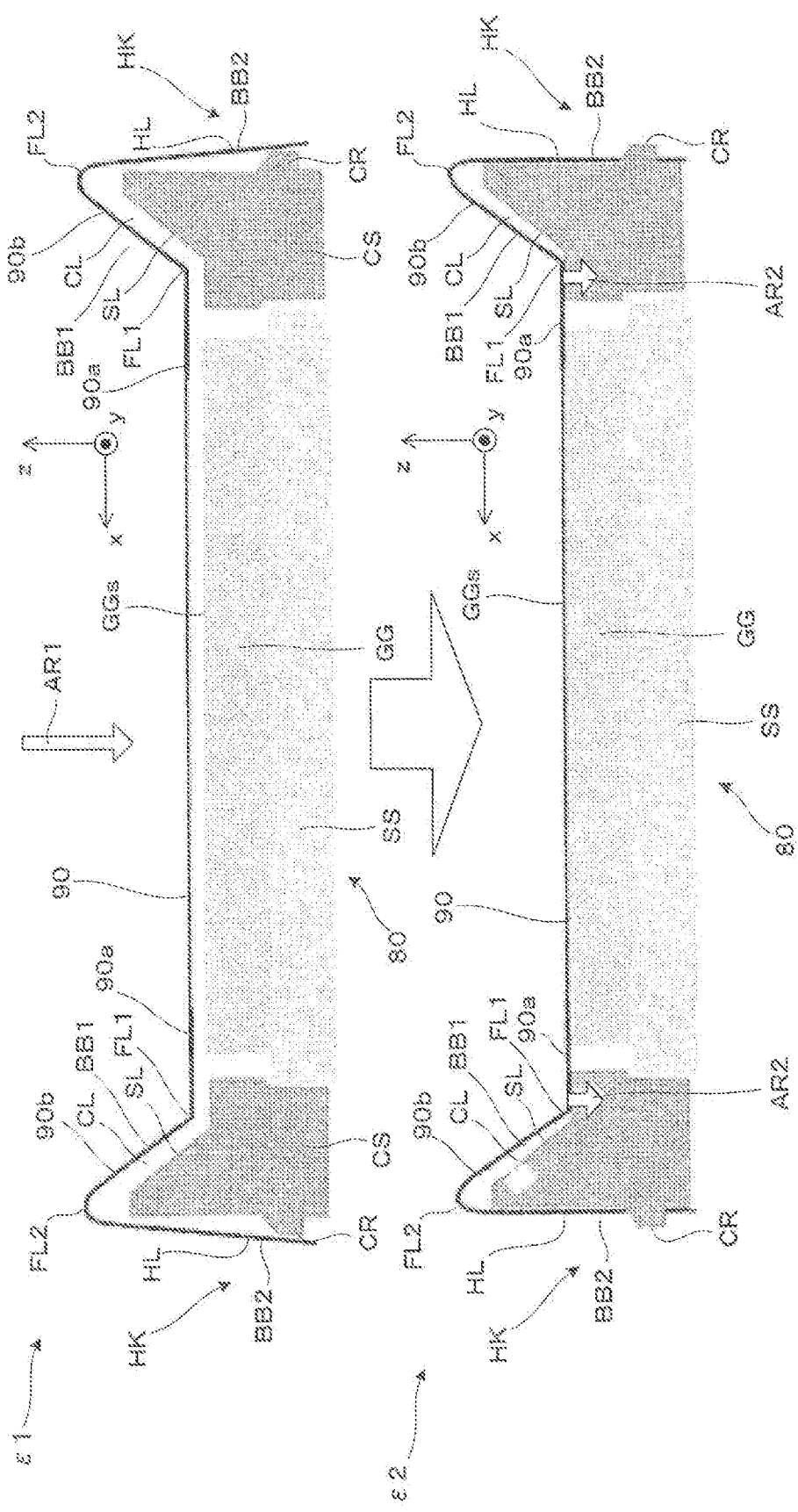
FIG. 12 is a conceptual diagram for illustrating an example of mounting of a light shielding plate.

First, as an assumption for describing the attaching step, as illustrated in FIG. 12, the light shielding plate 90 is here a portion formed by being bent two times, i.e., a bent portion FL including a first bent portion FL1 that defines a boundary between the planar portion 90*a* and the peripheral portion 90*b*, and a second bent portion FL2 provided midway in the peripheral portion 90*b* to cause the peripheral portion 90*b* to have an inclined shape or a stepped shape. As a result, the peripheral portion 90*b* is composed of a first plate-shaped portion BB1 formed between the first bent portion FL1 and the second bent portion FL2, and a second plate-shaped portion BB2 extending from the second bent portion FL2. The second plate-shaped portion BB2 is formed with a through-hole, and the second plate-shaped portion BB2 or a part thereof forms the hole HL. In the illustrated example, the first plate-shaped portion BB1 forms an inclined portion at a position slightly away from the image element 80 with the planar portion 90*a*.

In the above, first, as illustrated in the state ε1, the light shielding plate 90 is lowered in a direction (−z direction) of an arrow AR1 from above (+z side). In this case, as described above, alignment in ±x direction and ±y direction is performed using the alignment protrusions PSx and PSy constituting the alignment portion PSp. As the light shielding plate 90 is lowered in the direction of the arrow AR1, the second plate-shaped portion BB2 of the peripheral portion 90*b*, i.e., a portion including the hole HL, is expanded by the protrusion CR. When the light shielding plate 90 is further lowered in the direction of the arrow AR1, the hole HL fits onto the protrusion CR, as illustrated in the state ε2. At this time, while fitting using the hook structure HK formed of the hole HL and the protrusion CR is maintained by a force generating in the spring structure formed of the first and second bent portions FL1 and FL2, and the first and second plate-shaped portions BB1 and BB2, there is generated a force acting in a direction indicated by the arrow AR2 in which the planar portion 90*a* comes into close contact with the flat surface FF and the surface (glass surface) GGs. The force acting in the direction indicated by the arrow AR2 may be of the order of maintaining the close contact. In addition, maintaining the close contact here enables maintaining light shielding at appropriate places and preventing ingress of contaminations without creating a gap between the image element 80 and the case member CS.

In addition, when the force using the spring structure as described above is generated, a slight clearance CL is formed between the first plate-shaped portion BB1 as an inclined portion and the inclined portion SL provided in the case member CS corresponding to the first plate-shaped portion BB1. Accordingly, even when there is tolerance for manufacturing error or the like, a state such as that described above is reliably generated by preventing a rattling state or an unhooked state due to influence of the tolerance. For example, if the bent portion is formed being bent once, there is a risk that sufficient close contact cannot be maintained depending on tolerance. In the present embodiment, such a situation can be avoided by forming the M shape as described above.

As an order of assembly in manufacturing of the image element unit DU, it is conceivable that first, the image element 80 is bonded and fixed to the case member CS in the step illustrated with reference to FIG. 10, and then the light shielding plate 90 illustrated with reference to FIGS. 11 and 12 is fixed.

As described above, the image element unit DU as well as the virtual image display apparatus 100 mounted with the image element unit DU, according to the present embodiment, includes the image element 80 configured to emit image GL, the case member CS configured to house the image element 80, and the light shielding plate 90 attached to the alignment portion PSp provided in the case member CS, defining an emission region for the imaging light GL from the image element 80, and blocking unwanted light of emission components. Accordingly, the image element unit DU and the virtual image display apparatus 100 can suppress light leakage for an unwanted component, while downsizing the device, by attaching the light shielding plate 90 with high accuracy using the alignment portion PSp provided in the case member CS.

Other

The present disclosure is described above based on the exemplary embodiments. However, the present disclosure is not limited to the above-described exemplary embodiments, and can be embodied in various aspects without departing from the spirit and scope of the present disclosure.

First, while in the above, for example, the case member CS is made of metal having high thermal conductivity, another material (e.g., resin material) may be applied (partially applied) as long as heat dissipation and housing position accuracy of the image element 80 are ensured.

In addition, while in the above, the light shielding plate 90 is a sheet metal (light shielding sheet metal), the light shielding plate 90 may be formed of a thin resin plate member (tape-shaped member or the like), for example, as long as a role as described above can be achieved.

While, in the above, the hook structure HK is configured such that the case member CS includes the protrusion CR, and light shielding plate 90 includes the hole HL, the reverse is allowed. In other words, there is also conceivable a structure in which the case member CS includes the hole (recessed portion) HL and the light shielding plate 90 includes the protrusion CR. Besides this, various aspects are available as long as structure allows fitting as in the hook structure HK. For example, there is conceivable a structure in which an end portion of the light shielding plate 90 is inserted into a cutout formed in the case member CS. It is also conceivable to vary the attachment position of the hook structure HK to various places besides the exemplary case.

While it is also conceivable that various materials are available for the material of the sheet metal used as the light shielding plate 90, and that SUS304 or the like may be used as the stainless steel described above, another stainless steel or metal other than stainless steel may be used.

As the image element 80, various devices other than the devices described above are available, such as an HIPS as a transmissive liquid crystal display device. For example, a configuration using a reflective liquid crystal display device is also available, and the present application is also applicable to a device using a digital micro-mirror device and the like, i.e., a DLP method, in place of the image display element formed of a liquid crystal display device and the like.

Additionally, occurrence of ghost light or the like may further be suppressed by appropriately providing AR coating in a lens surface of each lens.

In the above description, with respect to the place provided with the semi-transmissive reflective film that transmits a part of the imaging light and reflects another part of the imaging light, it is conceivable to provide an optical function surface formed of a diffraction element such as a volume hologram or the like, for example, in place of the semi-transmissive reflective film, to achieve a similar role.

While in the above description, the light-guiding member 10 and the like extend in the lateral direction in which the eyes align, the light-guiding member 10 may be disposed extending in the vertical direction. In this case, the light-guiding member 10 has a structure of parallel placement in a juxtaposed manner rather than in a series manner.

In addition, the technique of the disclosure of the present application, i.e., the casing (image element unit structure) having a structure for heat dissipation for unitizing the image display device (image element), is also available for display devices such as a camera finder, a compact projector, and the like.

In the case of other applications or the like as described above, when a display device unit (image element unit) does not require high accurate alignment with another optical component, for example, a structure without an attachment portion for the alignment (typically, a portion like the protrusion PR) may be used.

While in the above description, the element substrate of the image element 80 is a silicon substrate, other members such as quartz glass may be used when sufficient heat dissipation and position accuracy are ensured.

While in the above description, only an aspect in which the image light and the external light are superimposed is described, the present disclosure may be applied to a virtual image display apparatus capable of observation by switching between an aspect of using only image light and an aspect of using only external light without superimposition. As an example, the present application also can be applied to a display device that forms a so-called virtual reality (VR) image.

The technique of the disclosure of the present application may be used to be compatible with not only a virtual image display apparatus of a so-called closed-type (not see-through type) allowing only image light to be visually recognized, but also a so-called video see-through product including a display device and an imaging device.

Additionally, the technique of the disclosure of the present application is applicable to a binocular type hand held display or the like.

The optical system to be adjusted in position is not limited to the case of a projection lens such as that described above, and may be an optical system of a direct viewing type and an observation optical system.

As described above, a virtual image display apparatus according to an aspect of the present disclosure includes an image element configured to emit imaging light, a case member configured to house the image element, and a light shielding plate that is attached to an alignment portion provided in the case member and that defines an emission region for imaging light from the image element.

The virtual image display apparatus described above can suppress light leakage for an unwanted component, while downsizing the device, by attaching the light shielding plate with high accuracy using an alignment portion provided in the case member.

In a specific aspect of the present disclosure, the light shielding plate includes a planar portion at a place where a flat surface of the case member and a light emission surface of the image element are aligned flush with each other. In this case, the planar portion can be disposed suitably for light shielding.

In another aspect of the present disclosure, the planar portion has a frame shape provided in its central portion with an opening that defines a passage range of effective light of a component emitted from the image element, and the light shielding plate has a bent portion that is inclined shape or stepped at an outer edge of the planar portion. In this case, the passage range of effective light can be defined in the planar portion, and attachment structure of the light shielding plate can be provided in the bent portion.

In yet another aspect of the present disclosure, the case member is provided with an alignment portion corresponding to the planar portion. In this case, reliably alignment can be performed on the planar portion.

In yet another aspect of the present disclosure, the light shielding plate is a sheet metal. In this case, the light shielding plate can be easily and reliably positioned with high accuracy.

In yet another aspect of the present disclosure, baking finish or black plating is applied to the sheet metal. In this case, light blocking properties are sufficiently high, and occurrence of contaminations caused by the surface of the light shielding plate can be suppressed.

In yet another aspect of the present disclosure, the sheet metal has a spring structure formed by being bent multiple times. In this case, a simple and reliable attachment with high adhesion can be achieved using a force generated in the spring structure.

In yet another aspect of the present disclosure, a protrusion is provided in one of the case member and the light shielding plate, a hole corresponding to the protrusion is provided in the other of the case member and the light shielding plate, and a hook structure formed of the protrusion and the hole fixes the light shielding plate to the case member. In this case, the case member and the light shielding plate can be assembled and fixed using the hook structure.

In yet another aspect of the present disclosure, the image element includes a light emitting part configured to emit imaging light. In this case, weight-saving and downsizing of the image element and consequently weight-saving and downsizing of the whole device can be achieved.

In yet another aspect of the present disclosure, the image element includes a silicon substrate on which an organic EL element constituting the light emitting part is formed, and end surfaces other than a back surface of the silicon substrate are in contact with the case member. In this case, high accurate alignment can be achieved by using accuracy of dicing for forming the end surfaces of the silicon substrate, so that an adjustment range can be suppressed when the image element is assembled to another member. This enables downsizing of the entire device.

In yet another aspect of the present disclosure, the case member has an opened side on a side of the image element opposite to a side emitting imaging light to disperse heat. In this case, an increase in internal temperature of the image element is suppressed. Thus, deterioration in performance and shortening of life due to an increase in internal temperature can be avoided in even an image element of a self-luminous type, for example, to enable favorable image formation.

In yet another aspect of the present disclosure, the case member is provided at a plurality of places spaced apart along an extension direction of an FPC of the image element with respective adhesive coating portions. In this case, after fixing with an adhesive, resistance of the FPC in its extension direction, being likely to be subjected to stress, can be increased.

As described above, an image element unit according to an aspect of the present disclosure includes an image element configured to emit imaging light, a case member configured to house the image element, and a light shielding plate that is attached to the case member and that defines an emission region for imaging light from the image element.

The image element unit described above can suppress light leakage for an unwanted component, while downsizing the device, by attaching the light shielding plate with high accuracy using an alignment portion provided in the case member.

What is claimed is:

1. A virtual image display apparatus comprising:
   an image element configured to emit imaging light;
   a case member configured to house the image element; and
   a light shielding plate that is attached to an alignment portion provided at the case member and that defines an emission region for the imaging light from the image element,
   wherein
   the light shielding plate includes a planar portion at a place where a flat surface of the case member and a light emission surface of the image element are aligned flush with each other,
   the light shielding plate is a sheet metal,
   baking finish or black plating is applied to the sheet metal, and
   the sheet metal has a spring structure formed by being bent multiple times.

2. The virtual image display apparatus according to claim 1, wherein
   the planar portion has a frame shape provided, in a central portion thereof, with an opening that defines a passage range of effective light of a component emitted from the image element, and
   the light shielding plate has a bent portion that is inclined or stepped at an outer edge of the planar portion.

3. The virtual image display apparatus according to claim 1, wherein
   the alignment portion corresponds to the planar portion.

4. The virtual image display apparatus according to claim 1, wherein
   one of the case member and the light shielding plate is provided with a protrusion,
   the other of the case member and the light shielding plate is provided with a hole corresponding to the protrusion, and
   a hook structure including the protrusion and the hole fixes the light shielding plate to the case member.

5. The virtual image display apparatus according to claim 1, wherein
   the image element includes a light emitting part configured to emit the imaging light.

6. The virtual image display apparatus according to claim 5, wherein
   the image element includes a silicon substrate at which an organic EL element constituting the light emitting part is formed, and an end surface other than a back surface of the silicon substrate is in contact with the case member.

7. The virtual image display apparatus according to claim 1, wherein
   the case member is open on a side for dissipating heat, the side being opposite from a side on which the image element emits imaging light.

8. The virtual image display apparatus according to claim 1, wherein
   the case member is provided, at a plurality of places spaced apart along an extension direction of a flexible printed circuit of the image element, with adhesive coating portions.

9. An image element unit comprising:
   an image element configured to emit imaging light;
   a case member configured to house the image element; and
   a light shielding plate that is attached to the case member and that defines an emission region for imaging light from the image element,
   wherein
   the light shielding plate includes a planar portion at a place where a flat surface of the case member and a light emission surface of the image element are aligned flush with each other,
   the light shielding plate is a sheet metal,
   baking finish or black plating is applied to the sheet metal, and
   the sheet metal has a spring structure formed by being bent multiple times.

* * * * *